(12) United States Patent
Vinet et al.

(10) Patent No.: US 8,994,142 B2
(45) Date of Patent: Mar. 31, 2015

(54) FIELD EFFECT TRANSISTOR WITH OFFSET COUNTER-ELECTRODE CONTACT

(75) Inventors: Maud Vinet, Rives (FR); Laurent Grenouillet, Rives (FR); Yannick Le Tiec, Crolles (FR); Nicolas Posseme, Carantec (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 34 days.

(21) Appl. No.: 13/439,356

(22) Filed: Apr. 4, 2012

(65) Prior Publication Data

US 2012/0256262 A1    Oct. 11, 2012

(30) Foreign Application Priority Data

Apr. 4, 2011 (FR) .................................... 11 01004

(51) Int. Cl.
| | |
|---|---|
| *H01L 21/70* | (2006.01) |
| *H01L 27/12* | (2006.01) |
| *H01L 21/44* | (2006.01) |
| *H01L 29/786* | (2006.01) |
| *H01L 21/74* | (2006.01) |
| *H01L 21/762* | (2006.01) |

(52) U.S. Cl.
CPC ........ *H01L 29/78648* (2013.01); *H01L 21/743* (2013.01); *H01L 21/76283* (2013.01)

USPC ............................ 257/506; 438/675; 257/347

(58) Field of Classification Search
None
See application file for complete search history.

(56) References Cited

U.S. PATENT DOCUMENTS

| | | | |
|---|---|---|---|
| 2003/0203546 A1 | 10/2003 | Burbach et al. | |
| 2006/0189057 A1 | 8/2006 | Delpech et al. | |
| 2010/0201440 A1* | 8/2010 | Nowak | 327/581 |
| 2010/0244934 A1* | 9/2010 | Botula et al. | 327/530 |
| 2011/0256688 A1* | 10/2011 | Meiser et al. | 438/430 |
| 2012/0139080 A1* | 6/2012 | Wang et al. | 257/506 |

\* cited by examiner

*Primary Examiner* — Mark Tornow
*Assistant Examiner* — Priya Rampersaud
(74) *Attorney, Agent, or Firm* — Oliff PLC

(57) ABSTRACT

The field effect transistor comprises a substrate successively comprising an electrically conducting support substrate, an electrically insulating layer and a semiconductor material layer. The counter-electrode is formed in a first portion of the support substrate facing the semi-conductor material layer. The insulating pattern surrounds the semi-conductor material layer to delineate a first active area and it penetrates partially into the support layer to delineate the first portion. An electrically conducting contact passes through the insulating pattern from a first lateral surface in contact with the counter-electrode through to a second surface. The contact is electrically connected to the counter-electrode.

7 Claims, 6 Drawing Sheets

FIELD EFFECT TRANSISTOR WITH OFFSET COUNTER-ELECTRODE CONTACT

BACKGROUND OF THE INVENTION

The invention relates to a field effect device integrated on a substrate of semiconductor on insulator type and possessing a counter-electrode.

The invention also relates to a fabrication method of such a device.

STATE OF THE ART

With the continuous reduction of their dimensions, active device of integrated circuit, such as conventional transistors, are presenting more and more marked parasite effects on their electric characteristics, for example short channel effect. To remedy a certain number of these pitfalls, different solutions are envisaged.

The substrates on which the transistors are integrated have been modified to reduce certain of the parasite phenomena of transistors. These improved substrates are of semiconductor on insulator type. They are formed by a layer of semiconductor material separated from the support substrate by a dielectric material. Depending on the thickness of the layer of semiconductor material on which the field effect transistor is integrated, the substrate is said to be partially or fully depleted.

By successively using substrates of partially depleted and then fully depleted semiconductor on insulator type, the race towards miniaturization and on-going improvement of transistors has been able to be pursued.

Substrates of fully depleted semiconductor on insulator type have then been modified by reducing the thickness of the dielectric material layer and integrating a doped layer in the support substrate. This doped layer is made in proximity to the dielectric layer in order to form a ground plane. This ground plane enables better control of the parasitic effects of the transistor integrated on the semiconductor material layer, in particular short channel effect, by means of improved control of lowering of the drain electrode-induced barrier (DIBL). The use of a ground plane also enables the electric characteristics of the transistor to be easily modified, typically by making its threshold voltage vary.

The ground plane represents a new electrode of the transistor also called counter-electrode. This new electrode has to be associated with a potential which requires integration of an additional contact. This new constraint leads to integration of additional technological steps. The device is therefore more difficult to fabricate and also more difficult to integrate in circuits as it occupies a larger surface and a larger volume of material.

As illustrated in FIG. 1, a first transistor is made on a substrate of semi-conductor on insulator type which comprises a support substrate 1, an electrically insulating layer 2 and a semiconductor material layer 3. Support substrate 1 is made from silicon and is doped to form counter-electrode 4. An insulating pattern 5 is formed around the transistor to insulate source/drain electrodes 6 from the rest of semiconductor material layer 3.

Insulating pattern 5 defines a first active area 7 in semiconductor material layer 3. This first active area 7 contains source/drain electrodes 6 of the transistor and the conduction channel. Gate electrode 8 of the transistor is arranged between source/drain electrodes 6, above the conduction channel. Insulating pattern 5 extends down into support substrate 1 to define a first portion 9 in support substrate 1 and to laterally insulate counter-electrode 4 from the rest of support substrate 1.

Insulating pattern 5 defines a second active area 10 in the semiconductor material layer and a second portion 11 in the support substrate. This second portion 11 is electrically connected to first portion 7 by means of a second doped area 12 of opposite conductivity type to that of counter-electrode 4. The potential applied in second portion 11 by means of bump 13 is thereby also applied to counter-electrode 4 by means of doped area 12.

A second transistor of opposite type can be integrated next to first transistor. The architectures are similar, but the doping types are opposite, in particular areas 12a and 12b in contact.

It is apparent that this structure is difficult to implement and that it occupies a large volume of support substrate 1. It gives rise to large limitations in the biasing conditions as insulation between the different doped areas 12 is performed by means of PN junctions biased so as to be in off state. These limitations are all the more important as transistors of opposite types are arranged adjacently.

OBJECT OF THE INVENTION

It is observed that a requirement exists to provide a field effect transistor provided with a counter-electrode which presents reduced dimensions.

This requirement tends to be satisfied by means of a device which comprises:
- a substrate successively comprising an electrically conducting support substrate, an electrically insulating layer and a semiconductor material layer,
- a counter-electrode formed in a first portion of the support substrate facing the semiconductor material layer,
- an insulating pattern made from electrically insulating material surrounding the semiconductor material layer to delineate a first active area of semiconductor material and penetrating partially into the support layer to delineate the first portion,
- an electrically conducting contact passing through the insulating pattern from a first lateral surface in contact with the counter-electrode to a second surface, the contact being electrically connected to the counter-electrode.

It is also observed that a requirement exists to provide a method for fabricating such a device in simple manner.

This requirement tends to be satisfied by means of a method which comprises:
- providing a substrate successively comprising an electrically conducting support layer, an electrically insulating layer, a semiconductor material layer, an insulating pattern delineating a first active area in the semi-conductor material layer and a first portion in the support layer, the first active area and the first portion being facing one another,
- partially etching the insulating pattern to have access to the first portion of the support layer,
- depositing an electrically conducting film in contact with the first portion of the support layer, on the insulating pattern.

BRIEF DESCRIPTION OF THE DRAWINGS

Other advantages and features will become more clearly apparent from the following description of particular embodiments of the invention given for non-restrictive example purposes only and illustrated by means of the appended drawings, in which.

DESCRIPTION OF PREFERRED
EMBODIMENTS OF THE INVENTION

Figure 1:
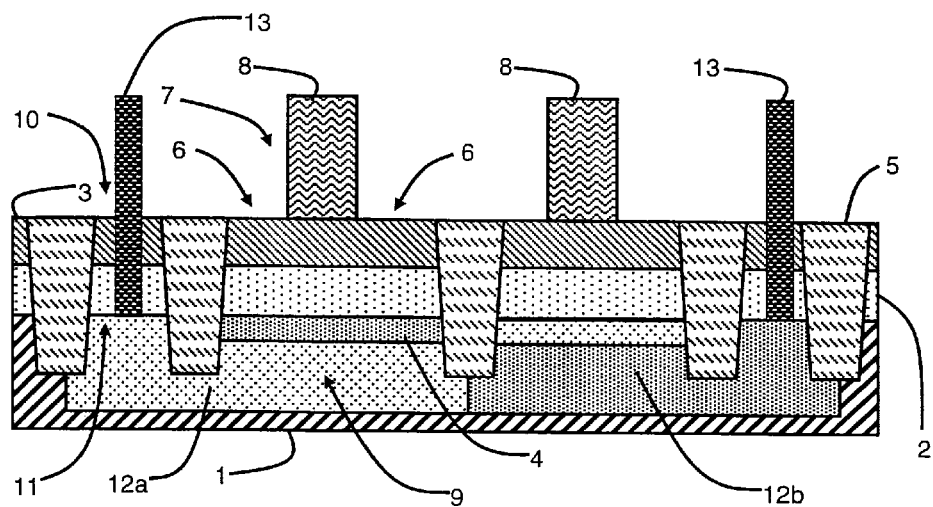
FIG. 1 represents a field effect transistor equipped with a counter-electrode and a remote contact, in schematic manner in cross-section.
Figure 2:
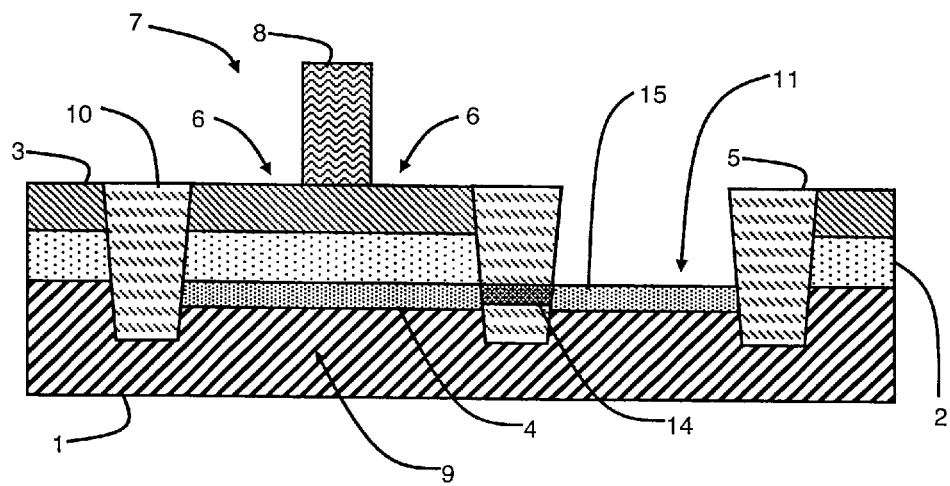
FIG. 2 represents another embodiment of a field effect transistor equipped with a counter-electrode and a remote contact, in schematic manner in cross-section.

As illustrated in FIG. 2, a substrate of semiconductor on insulator type successively comprises a support substrate 1, an electrically insulating layer 2 and a semiconductor material film 3. Semiconductor material film 3 is a layer called active layer as it is designed to integrate one or more field effect transistors or other devices.

Support substrate 1 comprises a film of electrically conducting material which is in contact with electrically insulating layer 2. In this way, the film of electrically conducting material of support substrate 1 is separated from film 3 by electrically insulating layer 2.

According to the embodiments, substrate 1 can be formed by one and the same semiconductor material or by a plurality of different electrically conducting films. In preferential manner, support substrate 1 is formed by a semiconductor material, for example silicon, which enables a controlled fabrication cost to be kept.

The electrically conducting film of support substrate 1 can be made from metal, a metal-based material, or a doped semiconductor material. The electrically conducting film is in contact with electrically insulating layer 2 which enables a large electrostatic effect to be had on the conduction channel.

The electrically conducting film is made from a material able to form a counter-electrode 4, for example a semiconductor material that is doped or that can be doped, or a metal.

As illustrated in FIG. 2, an insulating pattern 5 is formed. Insulating pattern 5 defines a first active area 7 in semiconductor film 3. Insulating pattern 5 also defines a first portion 9 of support substrate 1. First portion 9 and first active area 7 are delineated by insulating pattern 5. In this way, insulating pattern 5 encircles first portion 9 and encircles first active area 7. First portion 9 is arranged facing first active area 7. First portion 9 comprises counter-electrode 4 which is designed to be associated with the transistor that will be formed on first active area 7.

Figure 3:
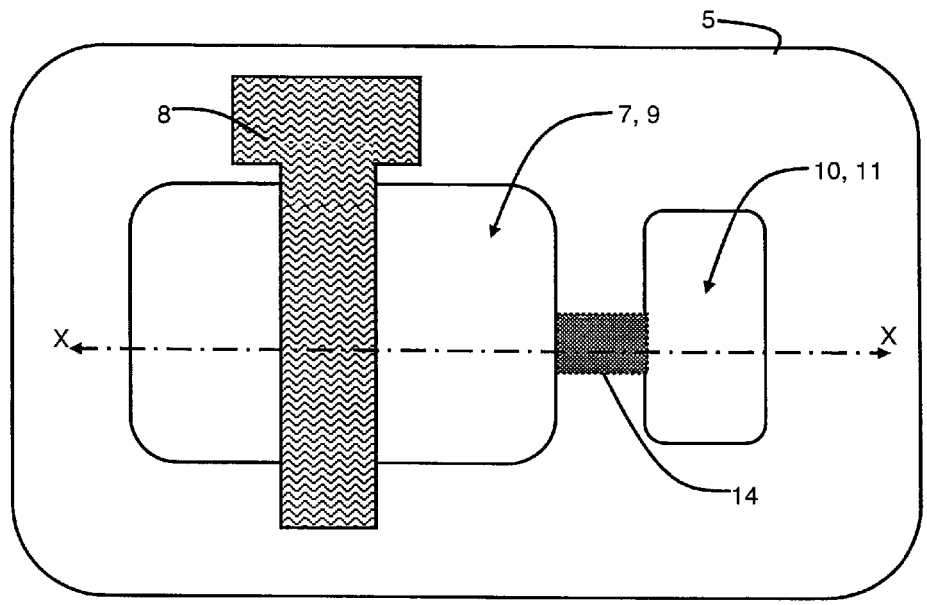
FIG. 3 represents the field effect transistor equipped with a counter-electrode and a remote contact illustrated in FIG. 2, in schematic manner in cross-section.

As illustrated in FIGS. 2 and 3, insulating pattern 5 can define a plurality of active areas in semiconductor film 3 and a plurality of portions in support substrate 1. The pattern of insulating pattern 5 is complementary to the pattern of the portions of support substrate 1 and to the pattern of the active areas.

Insulating pattern 5 can be perceived as a pattern made from electrically insulating material of annular shape. In this case, one or more stacks of layers of the substrate are located inside the ring. To prevent short-circuiting, the different active areas are laterally separated from one another by insulating pattern 5. The different portions of support substrate 1 are also laterally separated from one another by insulating pattern 5 to prevent short-circuiting.

In other words, insulating pattern 5 enables the future transistor to be electrically insulated from the other adjacent components. Insulating pattern 5 also enables the future counter-electrode 4 to be laterally insulated from the rest of substrate 1, for example from other counter-electrodes. In a preferred embodiment, vertical insulation in the substrate can be achieved by means of P/N or NIP junctions or by means of P+/P or N+/N junctions. The doped wells serving the purpose of forming the junctions are preferably shallower than insulating pattern 5.

The transistor comprises an electrically conducting contact 14 which passes through insulating pattern 5 from a first lateral surface which is in contact with counter-electrode 4 to a second surface. This pass-through contact 14 enables counter-electrode 4 to be biased without passing through active area 7 which avoids having to sacrifice a part of the volume dedicated to source/drain electrodes 6 or to the channel. This configuration also avoids passing under insulating pattern 5 which limits the volume occupied by the counter-electrode. This approach enables for example transistors with a counter-electrode with a high density of integration to be integrated without necessarily using additional insulating means such as reverse-biased PN diodes. Insulation is performed by insulating pattern 5.

In the example illustrated in FIG. 3, contact 14 is a simple conducting strip which passes through insulating pattern 5 from a first lateral surface to an opposite second lateral surface so as to facilitate biasing from an uncovered area of insulating pattern 5, for example a second active area 10 or a second portion 11 of support substrate 1. FIG. 2 is a cross-sectional view of the transistor illustrated in FIG. 3 along axis XX. Contact 14 electrically connects first portion 9 to second portion 11 and is coated on its other surfaces by insulating pattern 5. Contact 14 can be of any shape. In preferential manner, first portion 9 comprises a conducting area 15, for example a doped area of support 1, a silicide or a metal, in contact with contact 14 to bias counter-electrode 4.

Figure 4:
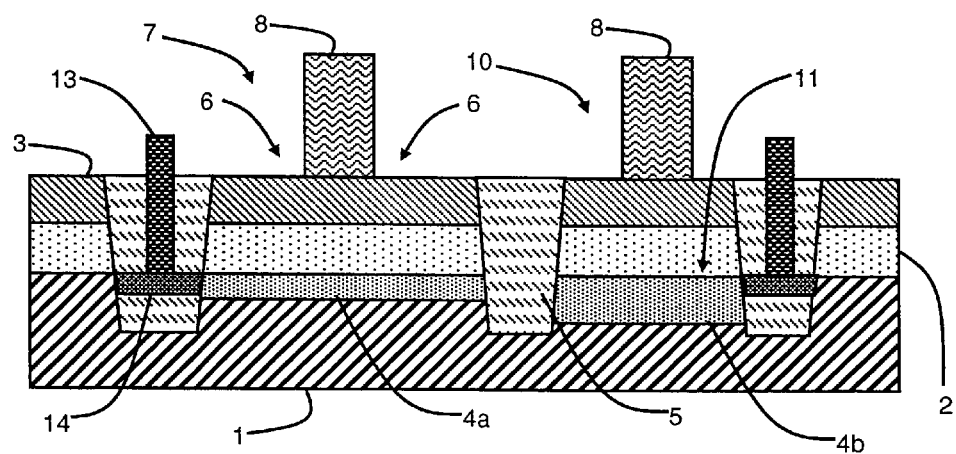
FIG. 4 represents two field effect transistors each equipped with a counter-electrode and a remote contact, in schematic manner in cross-section.

However, in another embodiment illustrated in FIG. 4, contact 14 can open onto a main surface of insulating pattern 5, for example the top surface of pattern 5 which is parallel to the main surface of semiconductor material film 3. In a particular case, the top surface of pattern 5 and the main surface of film 3 are in the same plane. In this particular embodiment, contact 14 can also pass through pattern 5 to connect another portion of the support substrate.

This particular embodiment for example enables two adjacent counter-electrodes 4 to be biased with the same potential even though the two counter-electrodes 4 are physically distinct from one another.

Contact 14 is arranged in the insulating pattern, preferably above a first layer of electrically insulating material, so as to reduce the electric impact of the bias of counter-electrode 4 on the support substrate.

Electric connection between counter-electrode 4 and contact 14 is made by means of their lateral surfaces, which enables large connection surfaces to be obtained for good application of the bias. As connection is made in lateral manner, the contact surface also depends on the thickness of the contact, on the thickness of the counter-electrode and on their overlapping surface. This architecture also enables constraints on the depth of sinking of the insulating pattern into the support substrate to be limited as contact 14 is formed through the pattern and no longer underneath the pattern as in the prior art.

In a preferred embodiment, contact 14 is formed in a different material from that forming counter-electrode 4 and with a higher conductivity than that forming counter-electrode 4.

In a particular embodiment illustrated in FIG. 4, two transistors are integrated on the substrate and are each associated with a counter-electrode. The two counter-electrodes 4a and 4b are formed by doping of the support substrate with different dielectric properties. For example purposes, the doping levels are different, the doping impurities are different, the doping types are different and/or the thicknesses of counter-electrodes 4a and 4b are different.

Each counter-electrode 4 is associated with a contact 14 which passes through insulating pattern 5 and exits on the top surface of the latter. However, in this particular embodiment, contact 14 is for example electrically connected to the adjacent portions of support substrate 1.

The transistor can be formed by a fabrication method illustrated in FIGS. 5 to 12.

Figure 5:
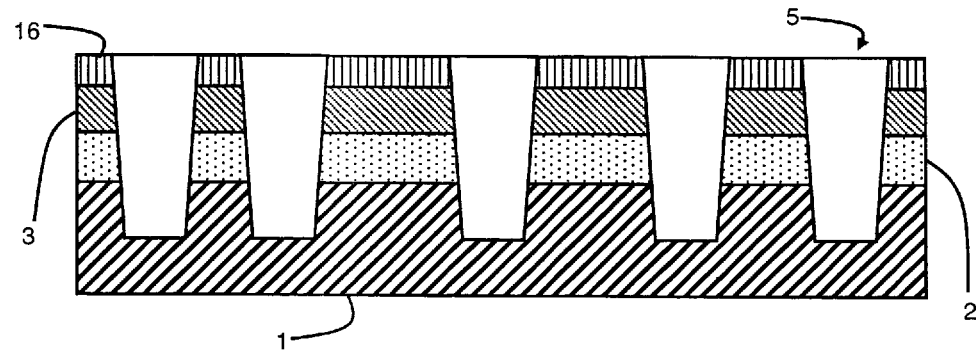
FIGS. 5 to 12 represent steps of an implementation mode of field effect transistors equipped with a remote counter-electrode contact, in schematic manner in cross-section or in top view.

As illustrated in FIG. 5 in cross-section, the main surface of the substrate is covered by an etching mask 16. The substrate is etched through etching mask 16 until a predefined depth of support substrate 1 is reached. Etching mask 16 simultaneously defines the active areas, the different portions of support substrate 1 and insulating pattern 5. In the illustrated example, insulating pattern 5 corresponds to the etched part of the substrate, which at this time is a void area.

To perform easy etching of the substrate, etching mask 16 is for example a dielectric material. In a particular manner, the material of etching mask 16 can be a silicon oxide, a silicon nitride or a stack of the latter.

A first electrically insulating material is deposited so as to fill the empty spaces formed following etching of the substrate. Insulating pattern 5 is then formed by the first electrically insulating material which is for example a silicon oxide. Etching mask 16 is produced by means of any suitable technique.

As illustrated in FIG. 5, for example purposes, the substrate comprises first, second, third and fourth active areas and portions of support substrate 1. The active areas are laterally offset from one another. The portions of support substrate 1 are also laterally offset from one another. First active area 7 is facing first portion 9. Second active area 10 is facing second portion 11. Third active area 16 is facing third portion 17. Fourth active area 18 is facing fourth portion 19. The active areas can be of any shape. The different active areas can also be arranged in any manner with respect to one another.

Figure 6:
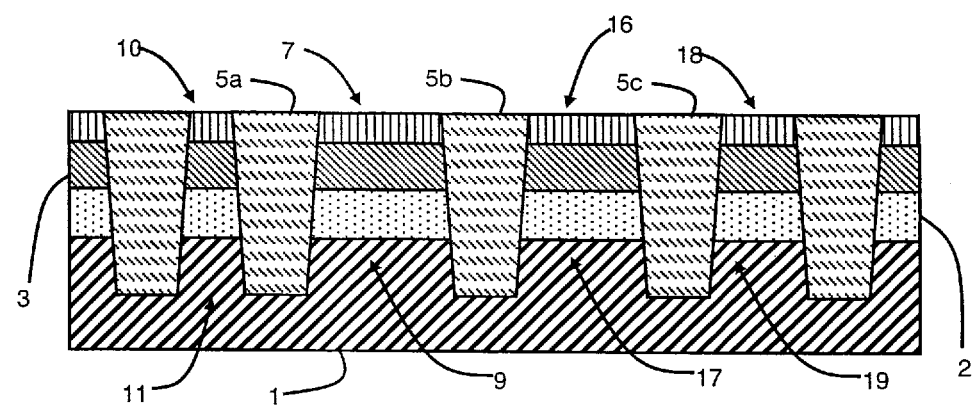

As illustrated in FIG. 6, although insulating pattern 5 surrounds all the active areas and the portions of the support substrate, for the sake of clarity, the insulating pattern is broken down into several elementary insulating patterns. A first insulating pattern 5a is arranged between first and second active areas 7 and 10. A second insulating pattern 5b is arranged between first and third active areas 7 and 16. A third insulating pattern 5c is arranged between third and fourth active areas 16 and 18.

If the first electrically insulating material is deposited on the whole of the substrate, an etching and/or chemical mechanical polishing step enables the first electrically insulating material to be located only in the holes formed in the substrate.

Figure 7:
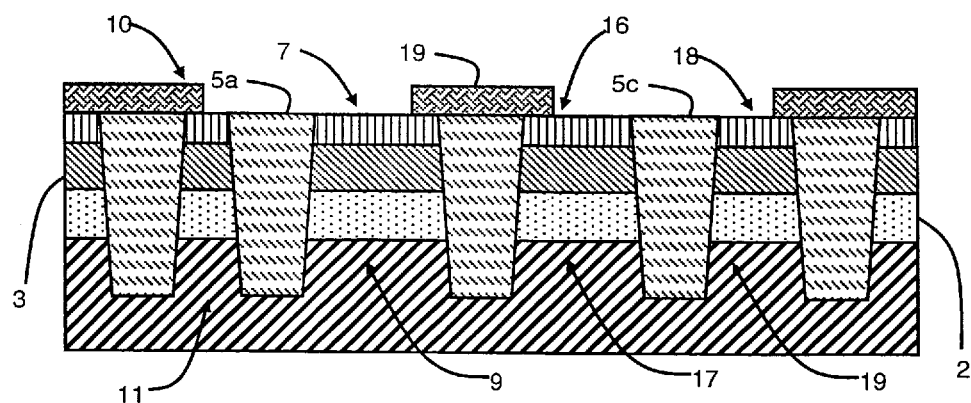

In preferential manner and as illustrated in FIG. 7, a second etching mask 19 can be used in order to limit the part of insulating pattern 5 that is to be eliminated. It is thus possible to etch the whole surface of insulating pattern 5 or to limit the extent of etching of the pattern around the active areas. It is further possible to specify that the pattern is to be kept on one side of the transistor whereas it has to be eliminated on the other side of the transistor.

Figure 8:
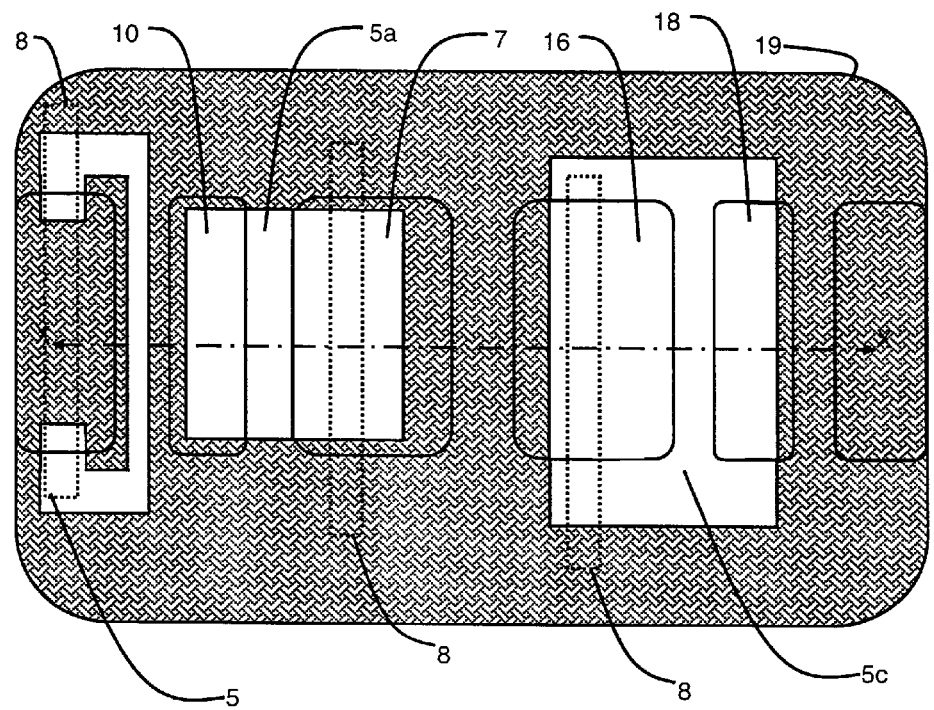

As illustrated in top view in FIG. 8, second etching mask 19 allows a greater flexibility in definition of the contact and in its extent inside insulating pattern 5. As illustrated in FIG. 8, for example purposes, second etching mask 19 can limit contact 14 to a lateral surface of active area 7 (central part of FIG. 8) or impose a contact 14 on several lateral surfaces of active area 16 (three successive lateral surfaces in the right-hand part of FIG. 8). It can also be envisaged to have a contact on all the lateral surfaces and therefore to form a biasing ring around the associated portion of the support substrate. It can also be envisaged to form a contact on two opposite surfaces of the portion of the support substrate (left-hand part of FIG. 8).

Figure 9:
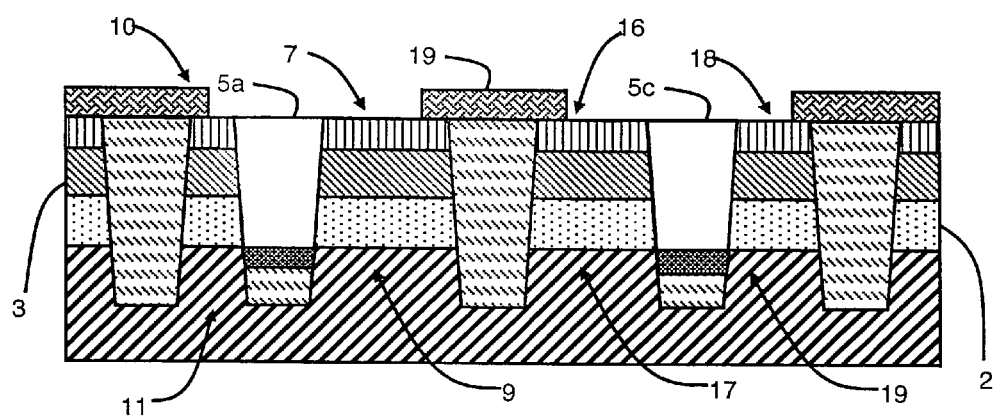
Figure 10:
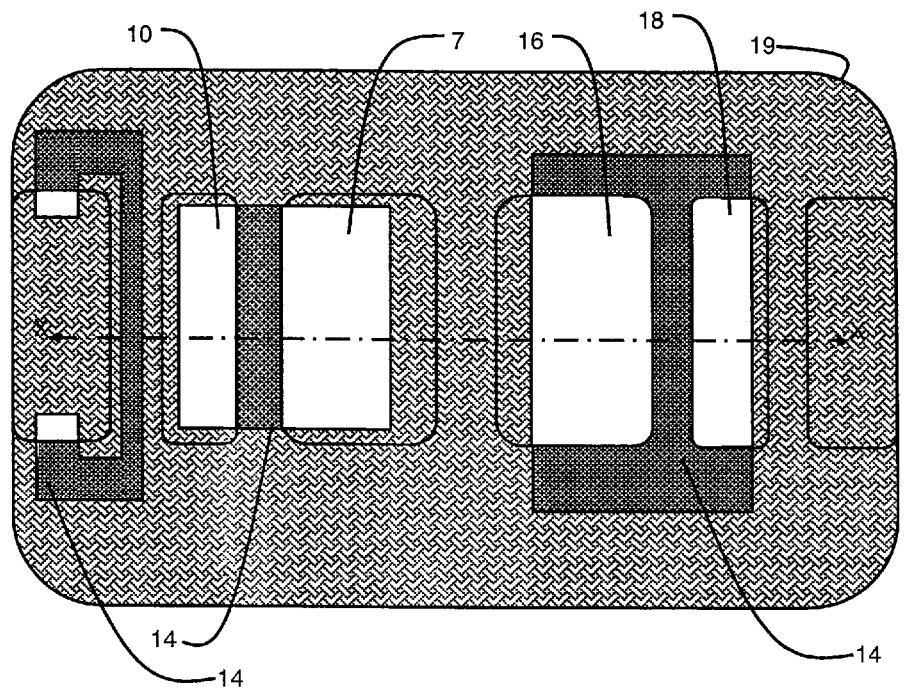

As illustrated in FIGS. 9 and 10, insulating pattern 5 is etched so as to reach the electrically conducting film of the support substrate. In this way, at least a lateral part of the film is released. In preferred manner, etching mask 16 is kept during partial elimination of the first electrically insulating material so as to protect the main surface of film 3. The depth to which etching is performed in insulating pattern 5 enables the position of contact 14 with respect to counter-electrode 4 to be defined.

In advantageous manner, etching of insulating pattern 5 is performed in anisotropic manner using second etching mask 19, but it is also possible to perform isotropic etching with or without a second etching mask.

Once counter-electrode 4 or the area serving the purpose of forming the counter-electrode is accessible, an electrically conducting film is deposited on the first electrically insulating material in insulating pattern 5 so as to be in electric contact with counter-electrode 4. The electrically conducting film enables contacting of counter-electrode 4 to be transferred from the surface defined by the active area. Contacting can then be performed in insulating pattern 5 or outside insulating pattern 5, for example in second portion 11.

If the electrically conducting film forming contact 14 is deposited under conditions such that it is present over the whole substrate and that it completely fills insulating pattern 5, it is possible to perform localization of the electrically conducting film by means of a chemical mechanical polishing step and/or a plasma etching step. The thickness of the electrically conducting film deposited in pattern 5 is preferably chosen such as to electrically connect the largest part of counter-electrode 4. The thickness of the electrically conducting film is thus chosen such as to reach electrically insulating layer 2.

In preferential manner, chemical mechanical polishing enables the electrically conducting material to be localized quickly and easily in the remaining volume of insulating pattern 5. In even more preferential manner, etching mask 16 is used to define stopping of the chemical mechanical polishing step.

In interesting manner, a wet etching or plasma etching step enables the thickness of the electrically conducting film in insulating pattern 5 to be reduced so that the latter is located under the level of the interface between electrically insulating layer 2 and semiconductor material film 3. This precaution prevents any short-circuiting between a source/drain electrode of the future transistor and counter-electrode 4. This implementation mode leaves a certain flexibility in the integration conditions of contact 14. It is possible to have a fairly thick contact 14 in order to limit series resistance problems.

In even more advantageous manner, the electrically conducting film forming contact 14 is arranged under the plane defined by the interface between support substrate 1 and electrically insulating layer 2. In this way, the electrostatic effect of contact 14 on source/drain electrodes 6 is reduced, which enables parasite effects on the switching rate of the transistor to be limited.

Electrically conducting contact 14 comprises an electrically conductive layer having a main surface parallel to the interface between support substrate 1 and electrically insulating layer 2. In preferential manner, the electrically conductive layer is arranged in the extension of counter-electrode 4 underneath electrically insulating layer 2.

However, from another point of view, it may be advantageous to keep a sufficient thickness of the electrically conducting film in order to have an electric contact between a source/drain electrode of the transistor and the counter-electrode.

In this way, depending on the etching masks used, it is possible to have an electrically conducting film which forms a ring around first portion 9 enabling a constant potential to be applied if the electrically conducting film is not very resistive. Contact 14 can comprise a salient area in a direction moving away from portion 9 containing counter-electrode 4 which facilitates establishment of a contact in an area having a lower contact density. It is also possible to limit the position of the electrically conducting film to a part of the transistor, for example on the source side or the drain side, in order to limit the electrostatic coupling or to take advantage of the common contact between these two electrodes.

In a privileged embodiment, the electrically conducting film is a metallic material. For example, the electrically conducting film is TiN which can be etched by wet process by means of a solution of $N_3OH$, $H_2O_2$ and $H_2O$ of "SC1" type or by means of a solution of HCl, $H_2O_2$, $H_2O$ of "SC2" type. The electrically conducting film can be tungsten (W) which can be etched by wet process by means of an HF solution diluted with HCl.

The electrically conducting film can also be a doped semiconductor film, for example doped silicon which can be etched by plasma with a HBr-based chemistry.

Figure 11:
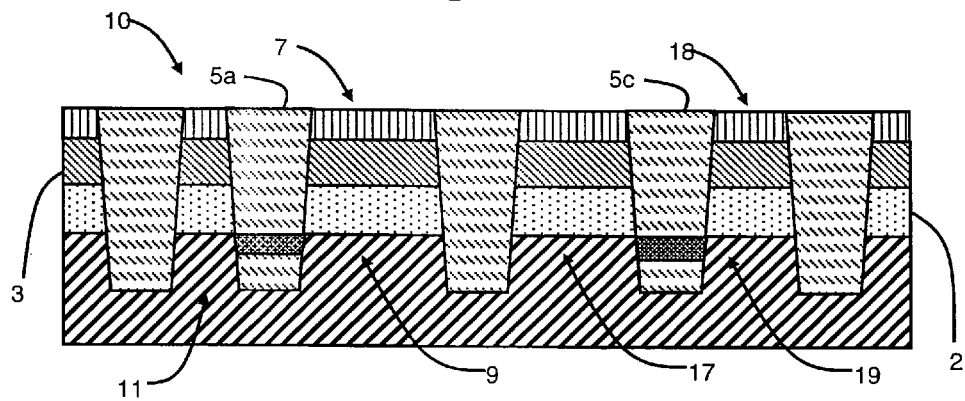

In a preferred embodiment illustrated in FIG. 11, insulating pattern 5 is again filled by a second electrically insulating material in order to facilitate the fabrication method of the future transistor. The second electrically insulating material can be identical to or different from the first electrically insulating material. Localization of the second electrically insulating material in insulating pattern 5 is performed in the same way as the first electrically insulating material.

Etching mask 16 which protected the main surface of first active area 7 is eliminated and a transistor is formed. The substrate is covered by an electrically insulating material and holes are formed in this material to reach gate electrode 8, and source and drain electrodes 6 and to come into electric contact with contact 14 outside first active area 7. Via 13 and other conducting vias are for example formed in this step.

Figure 12:
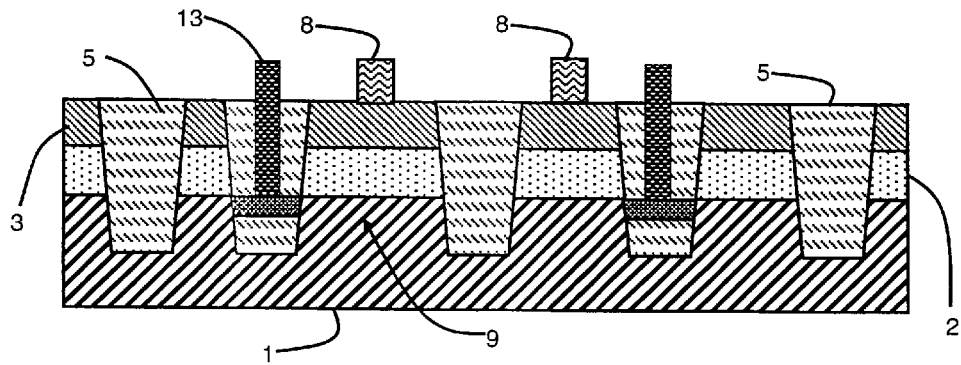

In a first embodiment illustrated in FIG. 12, a hole is formed in insulating pattern 5 and an electrically conducting via 13 penetrates into insulating pattern 5 until it reaches contact 14. In this way, it is not necessary to use a second active area and a second portion of support substrate 1 to perform biasing of counter-electrode 4. The second surface of insulating pattern 5 which enables contact 14 to pass through is a main surface of pattern 5 which is parallel to a main surface of semiconductor material layer 3.

Figure 13:
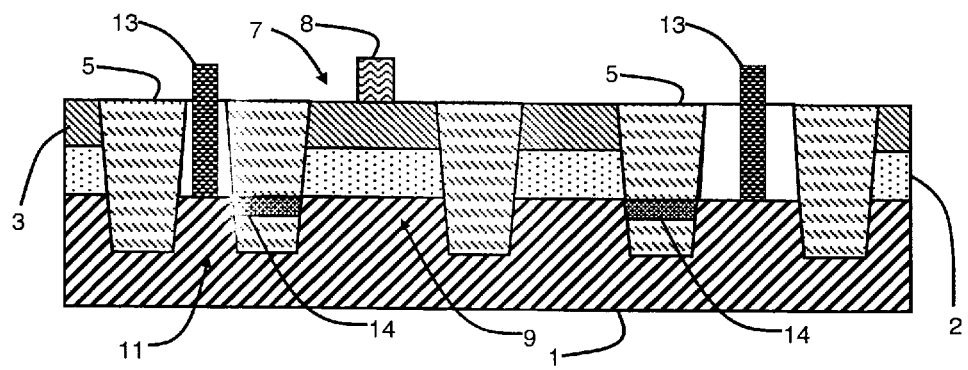
FIGS. 13 to 14 represent alternative embodiments of the remote contacts, in schematic manner in cross-section.

In a second embodiment illustrated in FIG. 13, contact 14 passes through insulating pattern 5 from a first lateral surface to a second lateral surface of insulating pattern 5. The first surface is a lateral surface of insulating pattern 5 which has an interface with first portion 9 of support substrate 1 and advantageously with first active area 7. The second surface is another lateral surface of the insulating pattern, for example the opposite surface, which has an interface with a second portion 11 of support substrate 1 and advantageously with second active area 10. The second active area is eliminated as is the part of electrically insulating layer 2 just above second portion 11 of support substrate 1. Electrically conducting via 13 is made directly on support substrate 1 in second portion 11 to bias counter-electrode 4.

Figure 14:
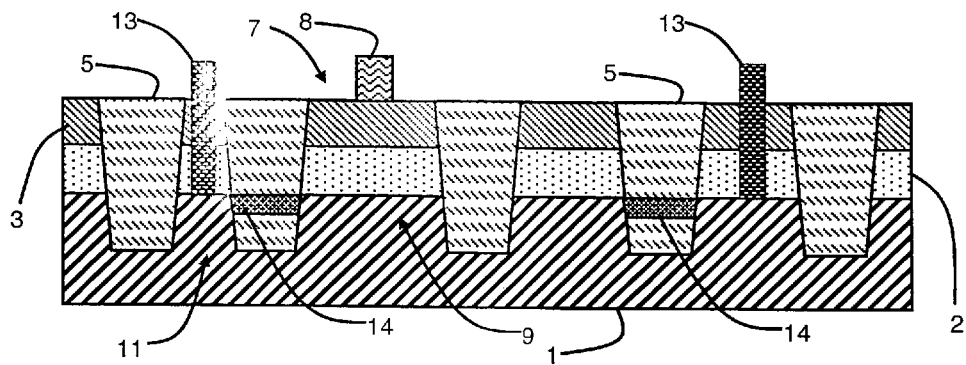

In another alternative embodiment illustrated in FIG. 14, via 13 penetrates through the second active area and through electrically insulating layer 2 so as to reach support substrate 1. In this way, the potential applied on support substrate 1 in second portion 11 is also applied to the counter-electrode via contact 14.

The three embodiments can be combined with one another according to the cases that arise.

In a particular embodiment that can be combined with the previous embodiments, counter-electrode 4 is only facing the channel of the transistor in order to limit the electrostatic effect on source and drain electrodes 6. The electrically conducting film of contact 14 is formed inside insulating pattern 5 which surrounds the active area and the first portion of the support substrate. Access can be had to counter-electrode 4 underneath gate electrode 8 without passing via the areas facing source and drain electrodes 6 and without being hampered by gate electrode 8 as illustrated in top view in the left-hand part of FIG. 10, the future gates being represented by a broken line.

In another particular embodiment which can be combined with the previous embodiments, second portion 11 of support substrate 1 comprises an electrically conducting layer which originates from the reaction between a metal and a semiconductor material forming the support substrate, for example a silicide such as a nickel or titanium silicide. This particular material enables the electric resistance between the conducting via and the counter-electrode to be limited. This embodiment is particularly easy to implement in the case of FIG. 13, for example when silicidation of the source/drain and gate electrodes takes place before the contacts/via are formed.

The electrically conducting film of contact 14 being deposited during formation of insulating pattern 5, the position of the electrically conducting film with respect to the position of electrically insulating layer 2 can be controlled. The deposited thickness of electrically conducting film can also be controlled in order to limit the electric resistance from conducting via 13 and/or to fix the electric influence of the electrically conducting film with respect to the substrate and to the rest of insulating pattern 5.

The electrically conducting film is preferably deposited before the field effect transistor is formed on the first active area.

Second etching mask 19 enables the extent of the electrically conducting film in insulating pattern 5 to be limited and also enables co-integration to be performed in the circuit and/or short-circuiting between two associated counter-electrodes 4 at different potentials to be prevented.

For example purposes illustrated in FIG. 4, two adjacent active areas are each associated with a field effect transistor which is integrated with a counter-electrode. The two active areas are laterally separated by insulating pattern 5. The same is the case for the two portions of the support substrate which are respectively facing the two active areas.

First counter-electrode 4a is connected to a first biasing source according to a first bias voltage whereas second counter-electrode 4b is associated with a second biasing source according to a second bias voltage. As the biases are applied through insulating pattern 5 and no longer by passing underneath the insulating pattern, a large bias range can be applied without any risk of short-circuiting.

In a particular embodiment that is not represented, when localization of the first electrically insulating material is performed in insulating pattern 5, the insulating pattern comprises a bottom part made from first electrically insulating material and a void area on top of the latter. The electrically conducting material is then deposited and then etched in order to delineate the future contacts 14. The shape of the contacts is for example achieved from a mask which has an opposite polarity to second mask 19.

The material forming contact 14 can be deposited by any suitable technique in more or less conformal manner. In the case of conformal deposition, it is preferable to completely fill the void volume of the insulating pattern and to then flatten and eliminate the electrically conducting material to have a contact 14 with the required thickness.

In the case of less conformal deposition with privileged growth in the bottom of the insulating pattern 5 with respect to deposition on the side walls, it is preferable to alternate the deposition and etching steps in order to form successive layers of conducting material until the required thickness is reached.

The invention claimed is:

1. A field effect transistor comprising:
   a substrate successively comprising an electrically conducting support substrate, an electrically insulating layer and a semiconductor material layer;
   a counter-electrode formed in a first portion of the electrically conducting support substrate, and overlapping the electrically conducting support substrate;
   an insulating pattern made from electrically insulating material surrounding the semiconductor material layer to define a first active area of semiconductor material and penetrating partially into the support layer to define the first portion, the insulating pattern including a bottom and side walls configured to contact the electrically conducting support substrate, the electrically insulating layer and the semiconductor material layer; and
   an electrically conducting contact passing through the insulating pattern from a first lateral surface in contact with the counter-electrode to a second surface, the electrically conducting contact being electrically connected to the counter-electrode,
   wherein the insulating pattern extends below the electrically conducting contact.

2. The transistor according to claim 1, wherein the electrically conducting contact includes an electrically conducting layer having a main surface parallel to the interface between the support substrate and the electrically insulating layer.

3. The transistor according to claim 2, wherein the electrically conducting layer is arranged in the extension of the counter-electrode underneath the electrically insulating layer.

4. The transistor according to claim 1, wherein the second surface of the insulating pattern is a main surface parallel to a main surface of the semi-conductor material layer.

5. The transistor according to claim 1, wherein the second surface of the insulating pattern is a lateral surface having an interface with a second portion of the support layer defined by the insulating pattern.

6. The transistor according to claim 1, wherein the counter electrode contacts the electrically insulating layer.

7. The transistor according to claim 1, wherein the first active area is covered by a gate electrode so as to define a source region and a drain region.

* * * * *